United States Patent [19]

Sugasawara

[11] Patent Number: 5,998,853
[45] Date of Patent: Dec. 7, 1999

[54] METHODS AND APPARATUS FOR ELECTRICAL MARKING OF INTEGRATED CIRCUITS TO RECORD MANUFACTURING TEST RESULTS

[75] Inventor: Emery Sugasawara, Pleasanton, Calif.

[73] Assignee: LSI Logic Corporation, Milpitas, Calif.

[21] Appl. No.: 08/900,845

[22] Filed: Jul. 25, 1997

[51] Int. Cl.[6] ................................................... H01L 29/00
[52] U.S. Cl. ............................................ 257/529; 257/209
[58] Field of Search ........................................ 257/209, 529

[56] References Cited

U.S. PATENT DOCUMENTS

| | | | |
|---|---|---|---|
| 4,210,875 | 7/1980 | Beasom | 330/261 |
| 5,698,887 | 12/1997 | Kumano et al. | 257/467 |
| 5,780,918 | 7/1998 | Aoki | 257/529 |

Primary Examiner—Valencia Martin-Wallace

[57] ABSTRACT

Semiconductor integrated circuits are electrically marked at final test time to form a permanent, visually and electrically readable record of the test results. The electrical record can provide a simple good/bad indication, i.e. indicate whether or not the device passed final test. This provides for more efficient handling of failed devices returned from the field, as the manufacturer can immediately determine whether the device in question passed final test before shipment—or inadvertently "escaped" from the manufacturer. The electrical marking technique, preferably using one or more fuses on board the device, can be used to record quiescent current test, speed sort test and various other final test results. These and other test results recorded on the chip are useful to quality and reliability studies, and in reducing the time and effort required to determine the failure mode of a returned device.

17 Claims, 8 Drawing Sheets

|  | A | B | C | TRISTATE |
|---|---|---|---|---|
| NO BLOW MODE (regular testing) | X | 0 | X | HIZ |
| BLOW | 1 | 1 | 0 | ON |
| READ | 1 | 1 | 1 = OK<br>0 - failure | ON |

FIG. 4

|  | A | B | C | D | TRI-STATE |
|---|---|---|---|---|---|
| BLOW | 1 | 1 | 0 | 1 | ON=Not Tri-State |
| READ | 1 | 1 | 1 = OK<br>0 - failure | 1 | ON |
| prohibited pattern | 1 | 1 | 0 | 1 |  |
| " | 0 | 1 | 1 | 1 |  |

FIG. 6

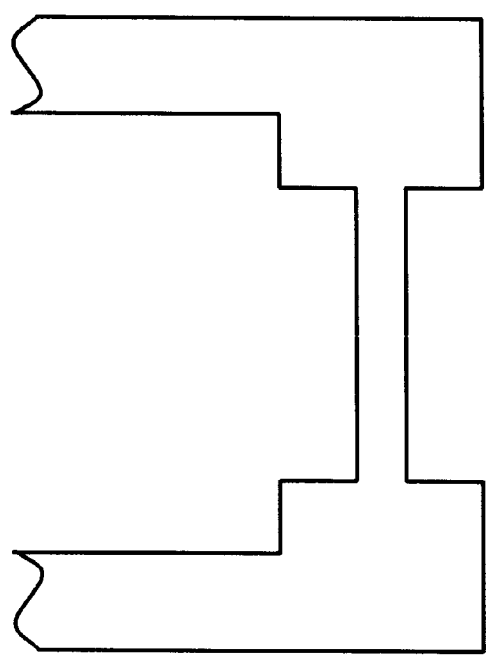
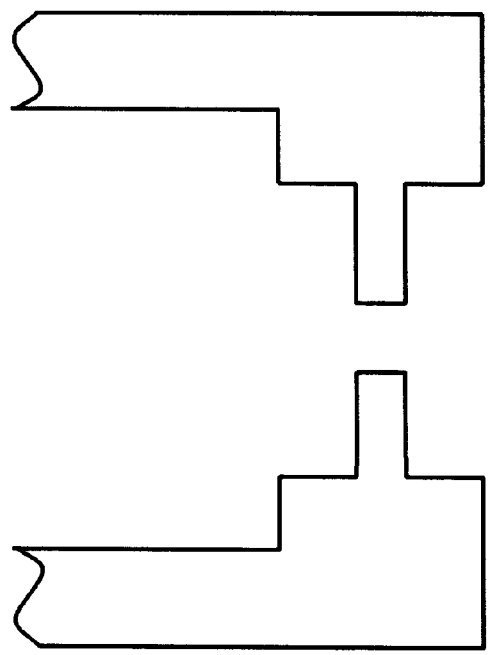
FIG. 9a  FIG. 9b

METHODS AND APPARATUS FOR ELECTRICAL MARKING OF INTEGRATED CIRCUITS TO RECORD MANUFACTURING TEST RESULTS

The present invention is in the field of semiconductor integrated circuits and, more specifically, is concerned with methods and apparatus for recording manufacturing test data within an integrated circuit device for various purposes as will be described shortly.

BACKGROUND OF THE INVENTION

During manufacturing of integrated circuits, various testing steps are wellknown for ensuring that the finished product will perform reliably and comply with applicable specifications. One set of tests are carried out at the "wafer sort" stage of a manufacturing process. Because silicon wafers are much larger than the individual integrated circuits formed on them, many such circuits are formed on a given wafer. The individual circuits are all formed at the same time as the photolithographic masks used in the manufacturing process contain many iterations of the individual circuit design, created by a step and repeat process.

After the various processing steps have been completed so as to form these multiple integrated circuits on a single wafer, the individual circuits are tested by connecting the lead bonding pads to suitable test equipment using fine wires or probes. When the test equipment detects a bad circuit, that individual die is marked, typically with red ink, to identify this fact. Subsequently, after the wafer is cut apart into individual die, those die that have red marks are discarded. This wafer sorting saves the substantial cost of packaging, further handling and final test of circuits already known to be defective. Die marking with ink is not especially convenient or efficient, however, and the industry trend is moving toward an inkless sort—where automated test and handling equipment simply places bad chips in a corresponding bin without physically marking them. Inkless sort procedures have the disadvantage that it is impossible to distinguish good chips from bad by visual inspection. Consequently, if a bad die is accidentally mixed in with good die, it will proceed to subsequent processing and packaging steps.

After integrated circuit devices have been packaged, they undergo final testing. Some portion of the circuits that passed the wafer sort inspection will nonetheless fail at final test because they may have been damaged in handling or in the packaging process itself, or the packaging and bonding may be defective. In some cases, final testing may simply be more comprehensive than wafer sort. Although one could mark an integrated circuit on the exterior of the package to identify a defective device at final test, this is not commonly done. Rather, the devices that fail at final test are simply collected in the reject bin or pile. Those devices are discarded or recycled.

One problem with this well-known technology, however, is that "bad" ICs, i.e., those that failed final test, sometimes "escape" from the manufacturer and are shipped to customers. On the other hand, some devices that passed final test nonetheless fail in the field. When failed devices are returned to the manufacturer, it attempts the determine what caused the failure, so that it can continually improve upon and refine its circuit designs, manufacturing processes and quality assurance program. Failure analysis is often difficult and time consuming, and therefore expensive. When the failure mode cannot be determined through electrical testing at the device pins, it becomes necessary to break open the IC package to conduct a more detailed examination. In those cases where the device was bad to begin with, i.e, it had actually failed final testing but escaped to the customer, much time is wasted in failure analysis. That effort and expense could be avoided if the manufacturer could readily identify those integrated circuits that had failed final test but nonetheless were shipped inadvertently.

Moreover, the return of devices which were known to be bad before they were shipped corrupts statistical data with respect to reliability of the devices in question. The need remains, therefore, for ways to mark integrated circuits so as to form a permanent record of manufacturing test results. Moreover, if that record of test results can be accessed or read electrically, the identification of such devices could be accomplished quickly and automatically so that time is not wasted in failure analysis of those devices.

A related problem occurs in the context of sorting or selecting devices based on their operating speed. Many semiconductor integrated circuits are commercially available in more than one grade or speed specification. In some cases, the circuit design for the various grades are the same. The finished parts are simply tested and sorted according to operating speed, as faster devices are necessary or desirable in some applications, and generally command a premium price. As in other types of final testing, devices that have been tested and sorted according to speed are sometimes mishandled, and may be packaged or marked with a speed designation that is incorrect. Devices that are basically functional but fail to meet speed specifications are sometimes returned to the factory.

When devices are returned to the manufacturer because they fail to meet speed specifications, the failure analysis department again faces the challenging task of determining the cause of that failure. In some cases, as noted, there may have been no failure at all. Rather, the device was simply mismarked or misdirected at final test. It would be beneficial, therefore, if the manufacturer could readily and accurately determine what speed tests a returned device actually passed before it was shipped. For example, if a device was sold as being operational up to 100 megahertz ("MHz"), and then returned to the manufacturer because the customer found it operated only up to 85 MHz, the manufacturer certainly would want to determine the cause of the problem. If the failure analysis people could readily determine that the particular device only passed final testing at 60 MHz, there would be no need to investigate further. There actually was no failure.

Another test that is often applied to semiconductor integrated circuits is a quiescent current test. Excessive quiescent current is generally an indicator of a defect in a semiconductor device. Accordingly, a maximum quiescent current value typically is selected by the manufacturer for testing purposes, and devices that draw quiescent current greater than that specification are rejected. However, statistical data indicate that there is a marginal range of quiescent current, although below the maximum permissible value, in which failure is more likely. It would assist in failure analysis for the manufacturer to be able to ascertain what the quiescent current value of a failed device was at the time of final test when the device was functioning properly.

SUMMARY OF THE INVENTION

In view of the foregoing background summary, it is an object of the present invention to provide for electrical marking of a die to provide a convenient, reliable record of manufacturing test results.

Another object of the invention is to effect electrical marking of an integrated circuit without increasing the die size or manufacturing cost.

A further object is electrical marking of a die so as to provide a convenient, readable record of final test results to support failure analysis after a failed IC is returned from a customer.

Another object of the invention is to mark a die so as to provide a visual indicator of manufacturing test results for optically distinguishing ICs that failed in the field from those that tested bad before shipment.

A still further object is to avoid any requirement for high voltage in connection with electrical marking of an IC.

Another object of the invention is to provide an electrical marking of a die to provide an electrical indicator of manufacturing test results even after a failed IC is returned from a customer, to easily and automatically distinguish ICs that failed in the field from those that tested bad before shipment.

A further object of the invention is to implement methods and apparatus for marking ICs so as to make a permanent, electrical record on-board the device of one or more final test results, which may include, without limitation, one or more of a pass/fail indication, a speed indication, a quiescent current indication, etc.

According to one aspect of the invention, a semiconductor integrated circuit ("IC") has a first I/O terminal or pad for external electrical connection to the IC and a second I/O terminal or pad likewise for external electrical connection. The IC further includes internal functional circuitry connected to at least one of the first and second I/O pad. The internal functional circuitry can be virtually any type of digital logic, processor, ASIC, etc. The specific type of semiconductor IC is not critical. The IC includes a "marking circuit" for electrically recording and indicating a manufacturing test result, the marking circuit including a circuit element having at least first and second stable states. In the preferred embodiments, the marking is effected by selectively blowing open one or more fuses in the IC. The marking circuit accomplishes blowing the fuse(s) under control of test equipment and also provides for later "reading" the marking by determining the state (open or closed circuit) of the fuse(s). The marling thus is permanent, non-volatile, and easily readable by automated or manual test equipment. This allows immediate identification of parts that failed final test but nonetheless "escaped" from the manufacturer to the customer.

Another aspect of the invention is a method of recording manufacturing test results in an integrated circuit device. The inventive method includes the steps of, first, providing at least one fuse within the integrated circuit device. In general, open areas are available in the design where one or more such fuses can be located without increasing the die size. The method further calls for providing circuitry within the integrated circuit device for selectively blowing the fuse. The integrated circuit device is tested prior to shipment of the device to a customer so as to determine a test result; and the method includes electrically marking the IC by selectively blowing or not blowing the fuse in accordance with the test result, thereby forming an electrically readable, permanent record of the test result on board the integrated circuit device. The new methodology can be used to record final test pass/fail results; device speed test results; quiescent current levels; and virtually any other test information that may be useful to later failure analysis—or to identification of parts that do not require failure analysis.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 4 is a state table illustrating operation of the marking circuitry of FIG. 3.

FIG. 6 is a state table illustrating operation of the marking circuitry of FIG. 5.

FIGS. 9A and 9B illustrate closed and open states of the fuse, respectively.

DETAILED DESCRIPTION OF A PREFERRED EMBODIMENT

Figure 1:
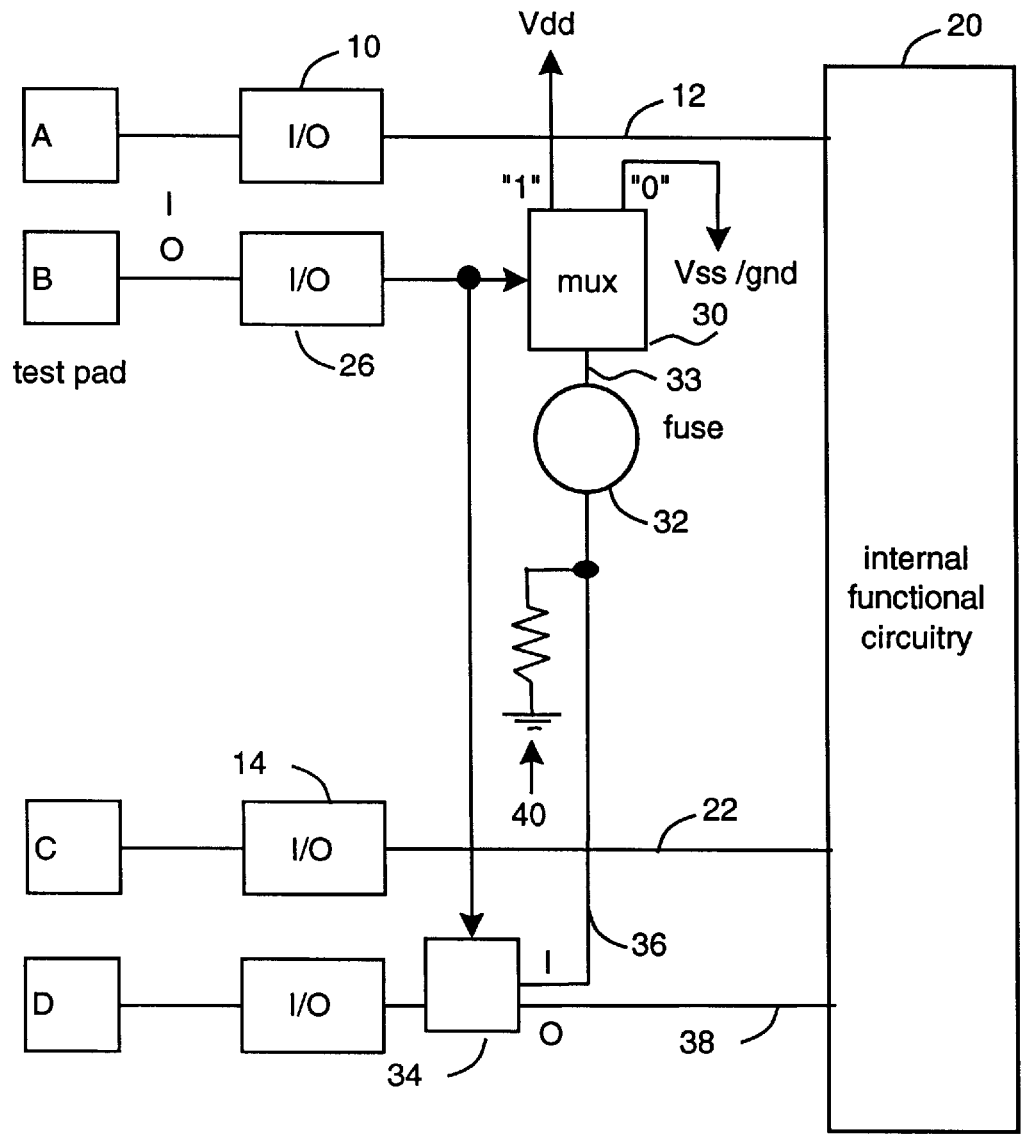
FIG. 1 is a simplified schematic diagram of one illustrative implementation of the present invention in a semiconductor integrated circuit.

FIG. 1 is a simplified schematic diagram of a portion of a semiconductor integrated circuit. The circuit includes a plurality of pads, labeled A, B, C and D, to which packaging leads (not shown) are attached or "bonded" for external connection to the device. Each pad is connected to input/output ("I/O") driver circuitry, to provide an appropriate electrical interface between the internal functional circuitry 20 and external circuits connected to the pads as is well known. For example, pad A is connected to I/O circuit 10 which in turn is connected via conductive path 12 to the internal functional circuitry 20. Similarly, pad C is connected to I/O circuit 14, which in turn is connected via path 22 to the circuitry 20. In this figure, pad B is a test pad, i.e., it is dedicated to test functions and is not used during normal operation of the device by the customer. Test pad B is connected to I/O circuit 26 which in turn drives a control signal on path 28 for controlling a first two-to-one multiplexer circuit 30. Multiplexer 30 has a first input labeled "1" connected to the supply voltage Vdd. The second input of mux 30, labeled "0", is connected to the lower supply voltage or ground, depending on the particular semiconductor technology in use. The mux input labels indicated which input is selected for each state of the control input 28.

A fuse 32, described in detail later, has a first node connected to the output terminal of multiplexer 30. A second node of fuse 32 is connected to a second multiplexer 34. The control signal from pad B, node 28, is connected to the control input of the second mux 34, for switching pad D between connection to the fuse via path 36 and, alternatively, connection to the functional circuitry 20 via path 38. A pull-down circuit 40, e.g. a resistor to ground, is connected to the second node of the fuse at 36. The pull-down circuit has relatively high impedance so that it does not sink so much current as to blow the fuse.

Figure 2:
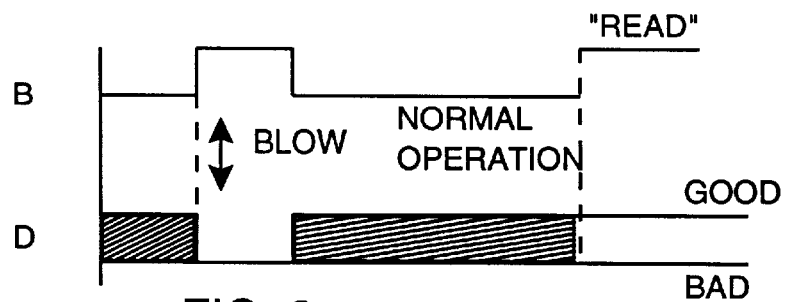
FIG. 2 is a timing diagram illustrating operation of the marking circuitry of FIG. 1.

Operation of the circuitry of FIG. 1 is illustrated by the timing diagram of FIG. 2. During testing, a bad part is electrically marked as such as follows. Initially, test pad B is at logic 0, and the mux 30 connects the first (upper) node of the fuse to ground. The fuse is initially a closed circuit. The logic 0 at pad B also controls the second mux 34 to connect pad D to the internal circuitry 20. Hence the second fuse node is pulled down to ground by the pull-down circuit 40. No current flows through the fuse.

Next, the tester equipment marks the part as bad (when appropriate) by blowing the fuse to an open circuit state. To do so, it asserts a logic 1 at test pad B, which switches both of the multiplexers. The first mux 30 now connects the first node of the fuse 33 to the supply voltage Vdd. The second mux 34 now connects the second node of the fuse to pad D. A logic 0 is asserted at pad D, thereby applying the full supply voltage across—i.e. in series with—the fuse 32, which blows the fuse open as it has very limited current carrying capacity. Details of integrated circuit fuses are known in other contexts and therefore are omitted here.

To "read" the electrical marking, which may occur much later after the part is returned from the field, the test pad B again is asserted to a logic 1, connecting the fuse node 33 to Vdd. The voltage at pad D is interrogated. If the fuse is still in tact, the supply voltage Vdd appears at pad D. If the fuse is blown open, ground or a low voltage appears at pad D. If the fuse is open, the manufacturer immediately knows that the part was earlier marked as bad, and failure analysis is obviated.

The marking circuitry of FIG. 1 is merely illustrative and the details will vary depending on the particular application. For example, the function illustrated herein as implemented by a multiplexer in some cases can be implemented by a few transistors and/or transmission gates. The concept is to controllably connect the fuse nodes as described.

Figure 3:
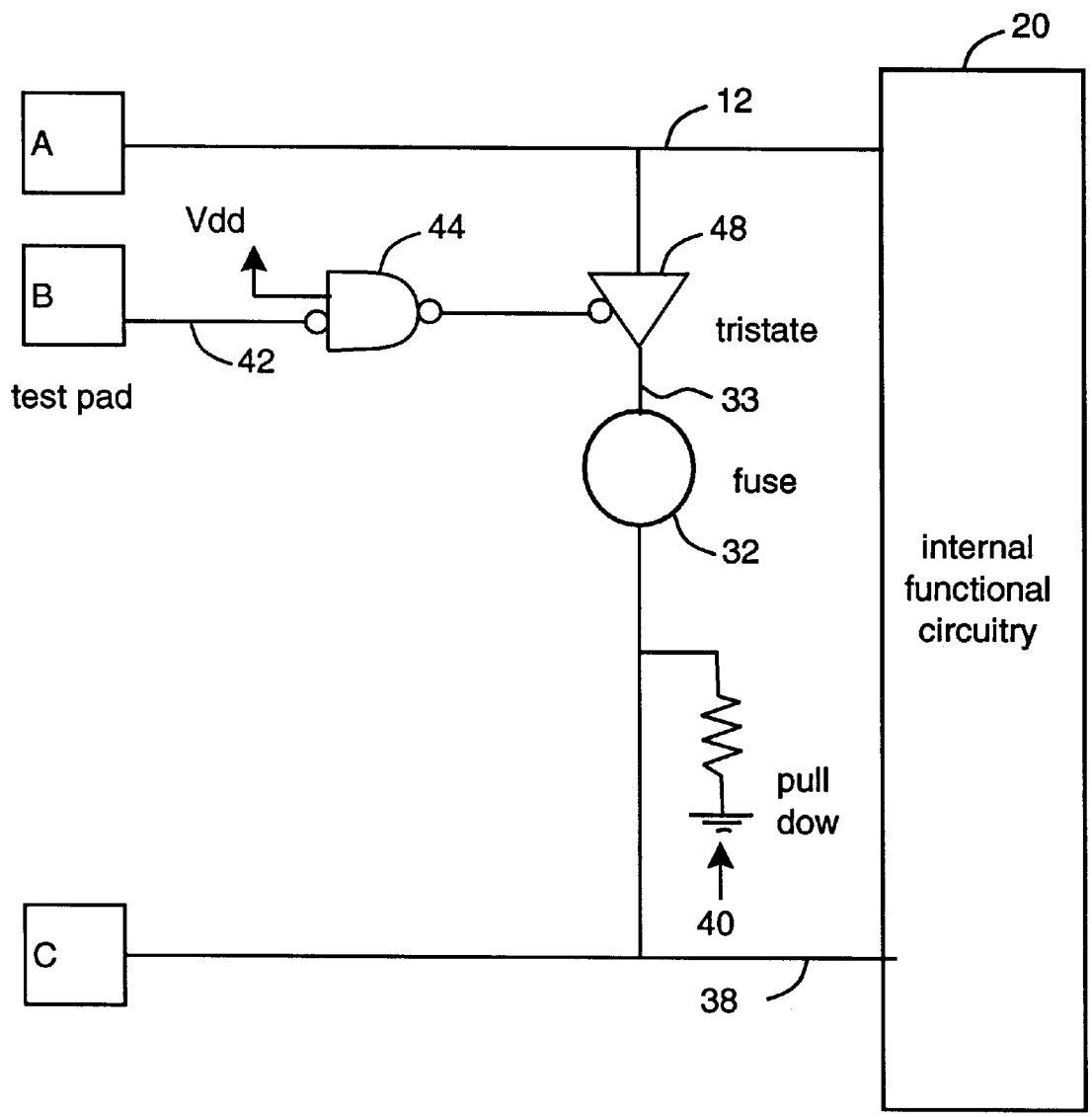
FIG. 3 is an alternative embodiment of the present invention in a semiconductor integrated circuit.

FIG. 3 is a simplified schematic diagram illustrating an alternative embodiment of the present invention. Like reference numbers are used to identify those elements previously described with respect to FIG. 1. (Input/output driver and protection circuitry is omitted for clarity.) The implementation illustrated by FIG. 3, like that of FIG. 1, assumes the availability of a dedicated test pad B. Here, test B is connected via path 42 to an inverting input of NAND gate 44. The other input to NAND gate 44 is coupled to Vdd or a logic 1. The output of NAND gate 44 is connected to an inverted control input to a tristate buffer 48. The input to tristate buffer 48 is connected to pad A at node 12 which also connects pad A to the internal circuitry 20. The output of tristate buffer 48 is connected to the first node 33 of the fuse 32. The second node of fuse 32 is connected to a pulldown circuit 40, as before. Second node of the fuse also is connected to pad C at node 38, which also is connected to the internal circuitry 20. Thus, pads A and C are used in ordinary operation of the device while pad B, as noted, is a dedicated test pad used only for testing and marking purposes as described herein.

FIG. 4 is a state diagram that illustrates operation of the circuit of FIG. 3. First, during regular testing, the A and C pads are both "don't care" conditions. A logic zero is presented at the test pad B which drives the output of NAND gate 44 low. A logic zero at the control input to tristate buffer 48 drives the tristate device to the high impedance mode, indicated as "hi Z" in the table of FIG. 4. To blow the fuse, a logic 1 is applied to the test pad, which drives the output of NAND gate 44 high, which turns on the tristate device 48 to a low impedance condition. The tristate buffer 48 therefore connects the logic signal at test pad A (node 12) to the fuse 32. A logic 1 is applied at pad A as shown in the table, and a logic zero is applied at pad C. This presents essentially the fill power supply voltage across the fuse, thereby blowing the fuse. For a read operation, a logic 1 is again applied at the test pad B to drive the tristate buffer to the low impedance state. A logic 1 is applied at pad A, and the result is read at pad C. If the fuse is still intact, the logic 1 applied at A appears at pad C. Conversely, if the fuse is blown to the open circuit condition, the pull-down circuit 40 provides a logic zero at pad C.

Figure 5:
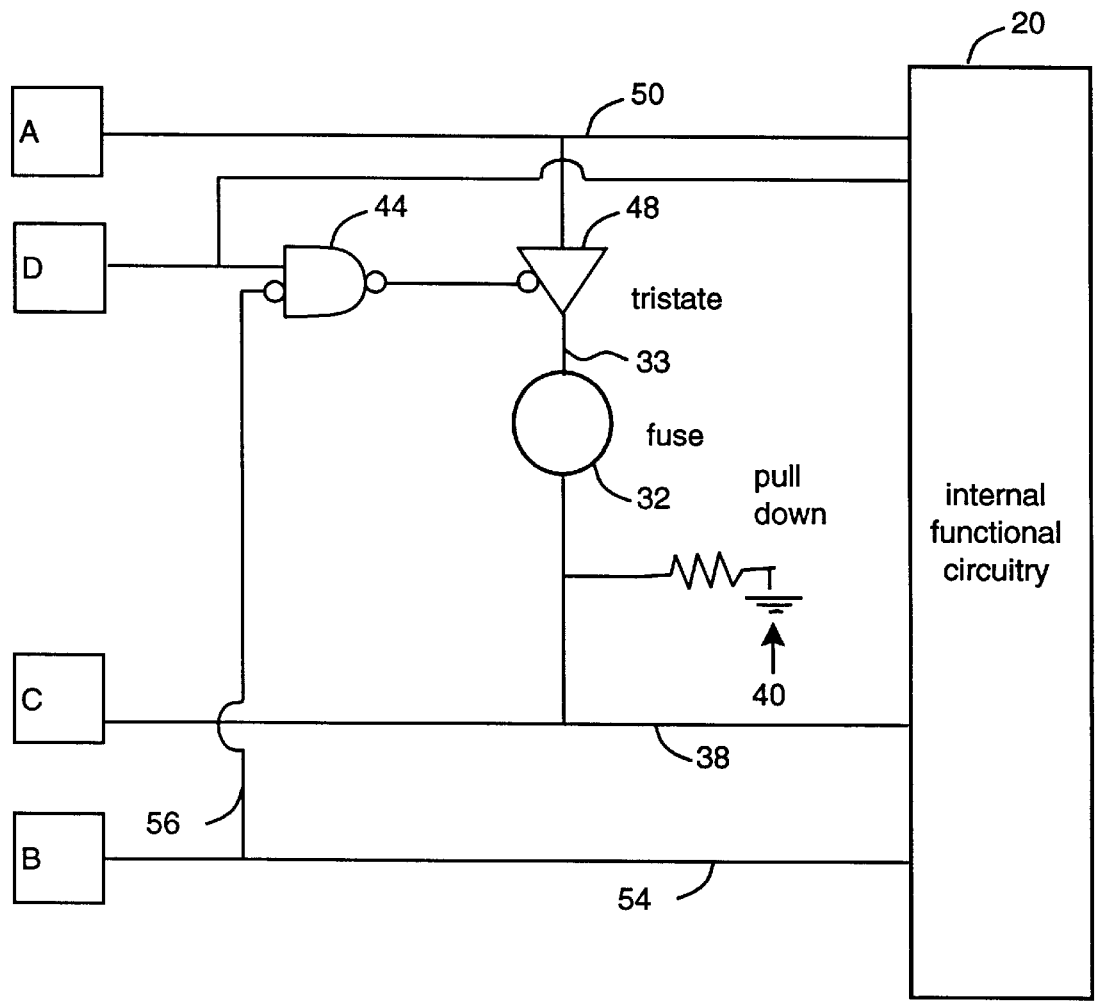
FIG. 5 is another alternative embodiment of the present invention illustrating a pin-limited design of the marking circuitry.

FIG. 5 is a simplified schematic diagram illustrating another alternative implementation in the context of a pad-limited design. Here, there is no pad available for use as a dedicated test pad. Accordingly, ordinary I/O pads are used for implementing marking and reading functions in addition to their other functions during normal (non-testing) operations. Referring to FIG. 5, pad A is connected via path 50 to the internal circuitry 20 and also is connected to the input of tristate buffer 48. The tristate buffer 48 controllably couples node 50 to the fuse 32 which in turn is connected to pad C are node 38. The fuse 32 (node 38) also is coupled to a pull-down circuit as before. Pad D is connected via path 52 to the internal circuitry 20, and also is connected to a first input to NAND gate 44. The output of NAND gate 44 is connected to the control input to a buffer 48. When this control signal is low, the tristate buffer 48 is driven to the high impedance output state. Pad C is connected via path 38 to the internal circuitry 20. Finally, pad B is connected via path 54 to the internal circuitry 20, and also is connected via path 56 to a second, inverted input to NAND gate 44.

Operation of the circuitry of FIG. 5 is illustrated with reference to the state diagram of FIG. 6. To mark the integrated circuit of FIG. 5 as a bad device, or to record other final test data as described previously, input B is driven to a logic 1 state which drives the output of NAND gate 44 high. This enables the buffer 48 to the ON (not high impedance) state. Accordingly, node 50 is coupled through the buffer 48 to the fuse 32. A logic 1 is applied at pad A and a logic zero is applied at pad C, thereby providing essentially the full power supply voltage across the fuse so as to blow the fuse. For a read operation, again pad B is driven to a logic 1 so that the tristate device is in a conducting state. A logic 1 is again applied at pad A and the state of the fuse can be read at pad C. If C is a logic 1, the fuse is still intact, for example indicating that the device passed final test. Conversely, if the fuse is blown, a logic zero appears at pad C due to the pull-down circuit 40. The only limitation in this design is that there are two patterns that are prohibited during testing. These are patterns in which B is a logic 1, so the tristate device is in the low impedance state, and the power supply voltage would be applied across the fuse—either because A is 1 and C is 0, or because A is 0 and C is 1. These patterns as indicated in FIG. 6 are prohibited to avoid inadvertently blowing the fuse.

Figure 7:
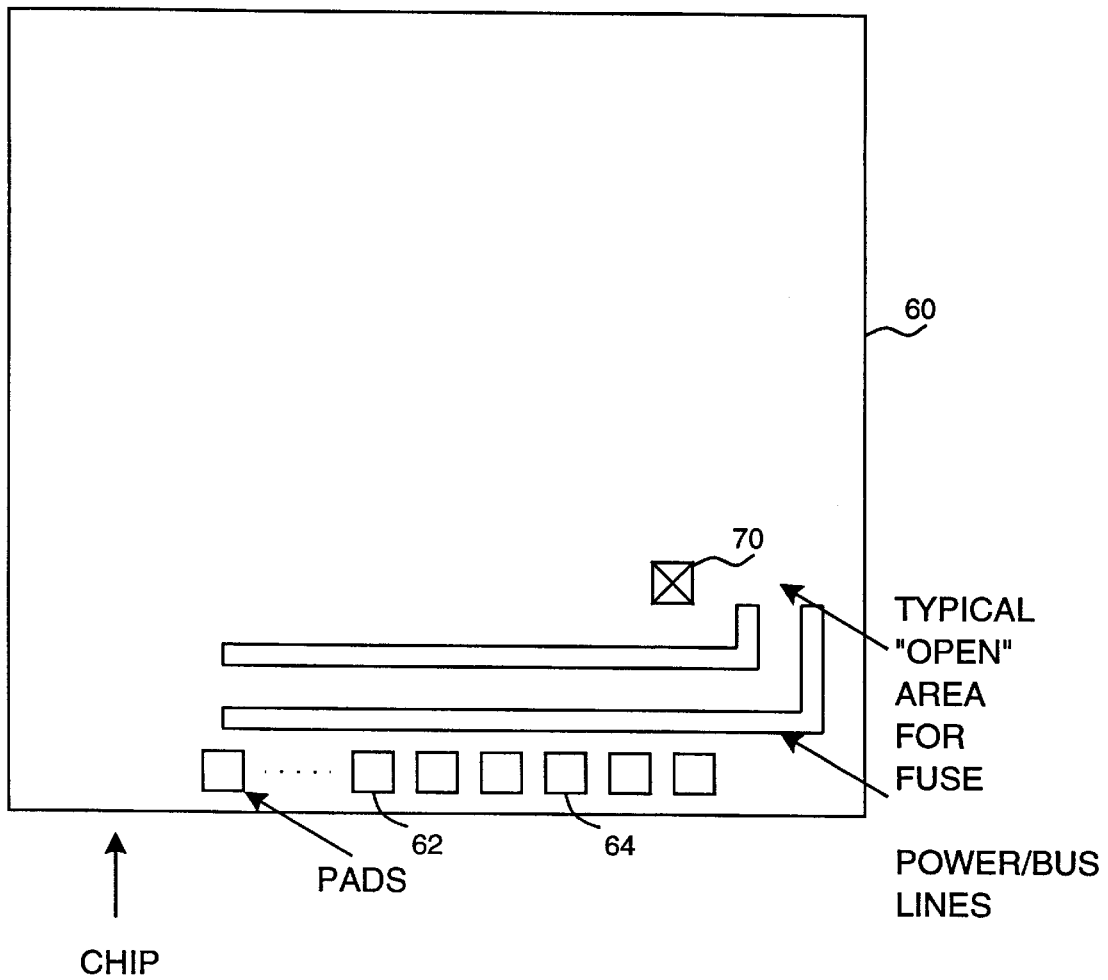
FIG. 7 is a simplified top plan view of an integrated circuit die illustrating an open area available for implementing a fuse according to the present invention.

FIG. 7 is a simplified diagram illustrating possible location of the fuse within an integrated circuit chip. The die 60 includes a series of bonding paths, for example paths 62 and 64, arranged along at least one edge of the chip. These bonding paths generally correspond to the paths A, B, C described in the previous drawings. Inside the bonding paths, i.e., toward the center of the chip, are a series of parallel conductors, for example conductor 68, which serve as power lines for distributing power supply voltage. Inside the power bus lines, open areas typically can be found, as illustrated by open area 70, in which the electrical marking circuitry described previously can be located without adding any additional chip area beyond that already necessary in connection with the design of the internal functional circuitry. Because additional chip area or "real estate" generally adds to the cost of the device, the electrical marking apparatus can be considered "free" in this regard. Its utility, however, is not limited to such applications, and there may be implementations where a modest increase in chip area is necessary for implementation of electrical marking circuitry.

Figure 8:
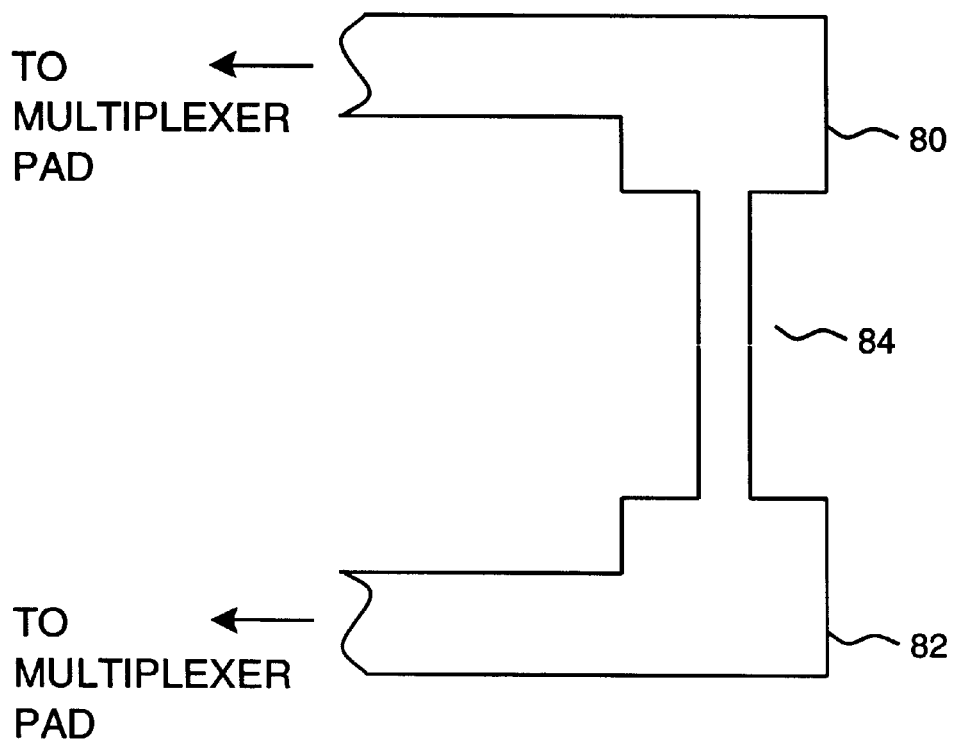
FIG. 8 is a top view of an integrated circuit fuse structure for use in connection with the present invention.

FIG. 8 is a top view of one design of a fuse useful in connection with the present invention. As shown in FIG. 4, one node of the fuse 80 is connected, in use, to a circuitry which can be used for coupling power supply voltage to the fuse. Similarly, a second, opposite node of the fuse 82 is coupled in use to a second circuit for controlling controllably coupling the second fuse node to a desired power supply voltage or ground. The first and second nodes of the fuse can be formed using the standard metal width, which is applicable to the particular process and integrated circuit technology in which the invention is applied. In a typical case, the overall length of the fuse is on the order of 10 microns or less. The fuse includes a relatively narrow portion 84 intermediate the first and second nodes and interconnecting them, at least initially. The narrow portion 84 may have a width, for example, on the order of 0.25 times the standard metal width for the device in question. The particular geometry of the fuse is not critical. When adequate voltage is applied across the nodes of the fuse, i.e., in series with the narrowed portion 84, that portion of the fuse will "blow open" so as to break open the electrical connection between the fuse nodes. Because the portion 84 is relatively narrow, it as a higher resistance and conversely, a lower current carrying capacity than the surrounding nodes. Consequently, when a sufficient voltage is applied, some portion of the material forming the narrow portion 84 will vaporize. The fuse can be formed of any suitable conductive material, for example, an aluminum-silicon material.

FIG. 9A illustrates the fuse before it is blown, and FIG. 9B illustrates the fuse after it has been blown. Because of the change in its appearance, the blown fuse can not only be "read" electrically, but it can be observed optically, under suitable magnification, during examination of a failed device.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A semiconductor integrated circuit comprising:
   a plurality of I/O terminals for external electrical connection to the IC;
   internal functional circuitry connected to at least one of the plurality of I/O terminals;
   a marking circuit for electrically recording and indicating a manufacturing test result associated with the internal functional circuitry, wherein the marking circuit is coupled to at least one of the plurality of I/O terminals, has at least first and second stable states, and includes a fuse comprising a metal strip having a width and a metal link having approximately 0.25 times the width of the metal strip; and
   means for reading the state of the marking circuit.

2. A semiconductor integrated circuit according to claim 1 wherein the fuse of the marking circuit is visible so as to allow a determination of the state of the manufacturing test result recorded in the marking circuit by optical inspection of the marking circuit after opening the IC package.

3. A semiconductor integrated circuit according to claim 1 wherein the marking circuit is electrically detectable so as to allow an electrical determination of the state of the manufacturing test result recorded in the marking circuit using test equipment connected to the I/O terminals without opening the IC package.

4. A semiconductor integrated circuit comprising:
   a first I/O terminal for external electrical connection to the IC;
   a second I/O terminal for extern electrical connection to the IC;
   internal functional circuitry connected to at least one of the first and second I/O terminals; and
   a marking circuit for electrically recording and indicating a manufacturing test result, the marking circuit having at least first and second stable states, wherein the marking circuit includes a fuse comprising a metal strip having a width and a metal link having approximately 0.25 times the width of the metal strip.

5. A semiconductor integrated circuit according to claim 1 wherein the fuse is formed of an aluminum-silicon material.

6. A semiconductor integrated circuit according to claim 1 wherein the fuse is formed of a non-metallic conductive material.

7. A semiconductor integrated circuit according to claim 1 wherein the fuse is sized and arranged so that the fuse will blow to an open circuit responsive to application of a normal supply voltage of the IC in series with the fuse.

8. A semiconductor integrated circuit according to claim 1 wherein the fuse includes first and second nodes and the marking circuit includes:
   a first fuse circuit for controllably coupling a first power supply voltage to the first node of the fuse in response to a first input signal; and
   a second fuse circuit for controllably coupling a second power supply voltage to the second node of the fuse in response to a second input signal, so that a voltage difference between the first and second power supply voltages is applied across the fuse so as to blow the fuse to an open circuit when both the first and second input signals are asserted.

9. A semiconductor integrated circuit according to claim 8 wherein at least one of the first and second fuse circuits includes first means for connecting the first fuse node to a most positive internal power supply voltage.

10. A semiconductor integrated circuit according to claim 9 wherein the first connecting means includes a logic gate.

11. A semiconductor integrated circuit according to claim 8 wherein at least one of the first and second fuse circuits includes means for connecting the second fuse node to most negative internal power supply voltage.

12. A semiconductor integrated circuit according to claim 11 wherein the connecting means includes a multiplexer circuit.

13. A semiconductor integrated circuit according to claim 8 wherein the first fuse circuit includes a tri-state device.

14. A semiconductor integrated circuit according to claim 1 wherein the means for reading the state of the marking circuit includes logic circuitry for coupling an externally applied voltage to the marking circuit for reading the state of the marking circuit, wherein the logic circuitry is coupled to at least one of the plurality of I/O terminals.

15. A semiconductor integrated circuit according to claim 1 wherein the marking circuit includes means for showing a physical change so that the physical change is visible by optical inspection.

16. A semiconductor integrated circuit according to claim 1 wherein:

the functional circuitry includes digital circuitry; and the means for reading is operative to output a binary signal, depending on the state of the marking circuit, on one of said I/O terminals, responsive to a binary signal input on another one of the I/O terminals.

17. A semiconductor integrated circuit according to claim 1 wherein at least one of the I/O terminals coupled to the marking circuit is also connected to the internal functional circuitry.